United States Patent [19]

Dziedzic

[11] 4,063,856
[45] Dec. 20, 1977

[54] PARTICULATE PRODUCT OF SELF SUPPORTING SPHERES CONTAINING INORGANIC MATERIAL AND APPARATUS FOR PRODUCING SAME

[75] Inventor: Chester J. Dziedzic, Dushore, Pa.

[73] Assignee: GTE Sylvania Incorporated, Stamford, Conn.

[21] Appl. No.: 702,539

[22] Filed: July 6, 1976

Related U.S. Application Data

[62] Division of Ser. No. 551,700, Feb. 21, 1975, abandoned.

[51] Int. Cl.² .............................................. B29C 13/00
[52] U.S. Cl. ............................................. 425/5; 425/8; 425/6
[58] Field of Search ................. 425/5, 8, 6, 10; 264/8, 264/14

[56] References Cited

U.S. PATENT DOCUMENTS

| | | | |
|---|---|---|---|
| 1,393,383 | 10/1921 | Linebarger | 425/6 X |
| 2,531,986 | 11/1950 | Pile et al. | 425/5 X |
| 2,543,132 | 2/1951 | Shabaker | 425/10 X |
| 2,574,357 | 11/1951 | Stammer et al. | 425/6 X |
| 2,738,548 | 3/1956 | Kassel | 425/6 X |
| 3,001,228 | 9/1961 | Nack | 425/6 X |
| 3,023,171 | 2/1962 | Smith | 425/6 |

*Primary Examiner*—Robert L. Spicer, Jr.
*Attorney, Agent, or Firm*—N. J. O'Malley; John C. Fox; Donald R. Castle

[57] ABSTRACT

Spherical particulates containing inorganic material are produced by forming a slurry of particles in an aqueous solution of a gellable organic binder, introducing droplets of the slurry into a two-phase liquid containing an upper hydrophobic phase for forming and maintaining the droplets in spherical form, and a lower ionic phase containing divalent or trivalent metal cations for promoting gellation of the organic binder, thereby converting the slurry droplets into substantially self-supporting spheres of particles dispersed in the gelled binder. Upon separation from the two-phase liquid and one or more optional heat treatments to remove the binder, to convert precursors into the desired final inorganic form, or to strengthen or densify the spheres, such spheres are useful, for example, as starting materials for single crystal growth from a melt.

1 Claim, 2 Drawing Figures

PARTICULATE PRODUCT OF SELF SUPPORTING SPHERES CONTAINING INORGANIC MATERIAL AND APPARATUS FOR PRODUCING SAME

CROSS REFERENCE TO RELATED APPLICATION

This application is a division of Ser. No. 551,700, filed Feb. 21, 1975, now abandoned and assigned to the assignee of the present invention. Assignment recorded Feb. 21, 1975, Reel 3169 Frame 187. D-9043 Ser. No. 698,130, filed June 21, 1976 is also a division of Ser. No. 551,700.

BACKGROUND OF THE INVENTION

This invention relates to a particulate product of self-supporting spheres containing inorganic material, and more particularly relates to spheres containing particles dispersed in a gelled fugitive organic binder matrix, and also relates to a method for producing them, and to apparatus for carrying out the method.

Spherical particulates of metals and ceramics have been used or proposed for use in a variety of applications, including nuclear fuel pellets, catalysts and catalyst supports, resin and filter beds or supports, and as starting materials in the growth of single crystals from a melt. A variety of approaches have been used to produce such spheres of a desired size, size distribution, purity, etc., and in commercially economical quantities.

Many of such approaches are based upon the so-called sol-gel process, wherein the normal time for dehydration and gellation of a hydrosol of a desired inorganic particulate is considerably shortened by contacting the hydrosol droplets with an aqueous ammonia solution. See U.S. Pat. No. 2,492,808, issued to Marisic et al., Dec. 27, 1949. Subsequent refinements or improvements of this sol-gel process are represented by U.S. Pat. Nos. 3,331,783, issued to Braun et al., July 18, 1967; 3,345,437, issued to Flack et al., Oct. 3, 1967; 3,586,742, issued to Chin et al., June 22, 1971; 3,728,421, issued to Noothout Apr. 17, 1973; and 3,845,179, issued to Wace, Oct. 29, 1974.

A variation of the sol-gel process is disclosed in U.S. Pat. No. 2,746,934, issued to Richardson et al., May 22, 1956, wherein gellation is achieved by contacting the hydrosol droplets with an anhydrous aluminum alcoholate, thereby to promote dehydration of the hydrosol by hydrolysis reaction of the water from the droplets with the alcoholate to produce alcohol.

All of the above techniques depend for their success upon the formation of relatively stable but readily gellable hydrosols, and thus their applicability is limited to certain materials or material systems.

Other approaches have been taken for the production of spherical inorganic particulates. In U.S. Pat. No. 3,258,311, issued to Burzynski et al., June 28, 1966, a single continuous phase emulsion is formed and then heated to promote phase separation and the formation of spherical particles, such as silica beads. In U.S. Pat. No. 3,848,059, issued to Erneta, Nov. 12, 1974, two inorganic salts are dissolved in water droplets of two separate water-in-oil emulsions, and the emulsions are subsequently mixed together so that the salts react to form insoluble spherical precipitates.

These techniques are also somewhat limited in their applicability due to the necessity for formation of relatively stable emulsions and chemical compatibility of the starting materials.

Further approaches to the production of spherical particles include atomization of molten material into a quenching medium such as an oil bath (See, for example, U.S. Pat. No. 3,472,922, issued to Knotik, Oct. 14, 1969); spray-drying a solution or slurry of the material (See, for example, U.S. Pat. No. 3,373,119 to Krystyniak), agglomerating, and pelletizing.

Atomization of molten material into a quenching medium is a high temperature process requiring the use of special materials and handling techniques and also gives rise to special contamination problems where purity of the spherical particulates is a consideration.

Spray drying, agglomerating and pelletizing are all characterized by the production of particles rather unspherical in shape and of a wide distribution of sizings necessitating in some cases classification to obtain desired narrow size fractions. Such handling operations tend to introduce undesired contaminants in addition to those normally introduced during contact with forming materials. In addition, it is difficult to obtain particles greater than about 70 mesh (210 microns) in size by any of the above techniques.

It is therefore felt that a technique for production of spherical particulates of inorganic materials which does not depend upon the production of stable hydrosols or emulsions, or upon solubilities or compatibilities with required chemical reactions of the organic materials, or upon melting of the inorganic materials, or upon contact with contaminating media, or upon size limiting factors, would be an advancement in the art.

SUMMARY OF THE INVENTION

In accordance with the invention, it has been discovered that self-supporting spherical particulates containing inorganic material may be produced by forming an aqueous solution of a gellable organic binder in which particles of the desired starting materials are slurried, introducing droplets of such slurry into a two-phase liquid having a first hydrophobic phase for forming and/or maintaining substantially spherical droplets, and a second ionic phase containing a gel promoting divalent or tri-valent cation of a soluble metal salt selected from the group consisting of $Ca^{2+}$, $Mg^{2+}$, $Ba^{2+}$, $Sr^{2+}$, $Fe^{3+}$, $Al^{3+}$, $Cr^{3+}$, for promoting gellation of the organic binder, thereby to achieve self-supporting spheres of the particles dispersed in the gelled binder matrix.

This binder material is chosen to have a volatilization temperature in the gel state below the decomposition temperature of the final desired chemical form, so that the binder may be subsequently substantially completely removed from the spheres by heating above this volatilization temperature. Further heating steps may optionally be carried out in order to convert starting material to a final desired form, such as by thermal decomposition or chemical reaction, or to strengthen or densify the spheres by sintering together of the particles, or a combination of these effects.

Spheres of high purity, (two nines or higher) are obtained by maintaining the concentration of the ionic species in the second phase of the two-phase liquid below that at which significant precipitation of salts would otherwise occur within the droplets during gel formation.

DETAILED DESCRIPTION OF THE INVENTION

Figure 1:
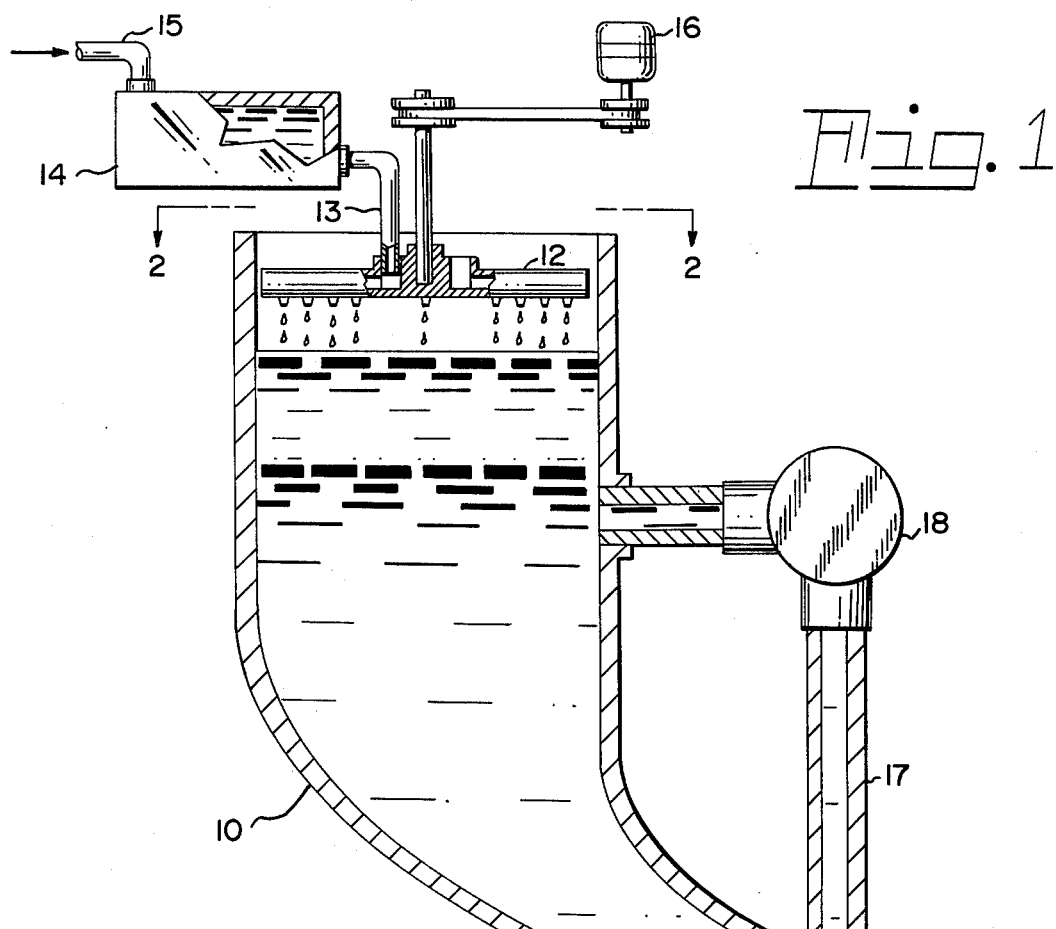
FIG. 1 is a front elevation view of one embodiment of an apparatus for carrying out the method of the invention to produce spherical inorganic particulates.

For a better understanding of the present invention together with other and further objects, advantages and capabilities thereof, reference is made to the following disclosure and appended claims in connection with the above-described drawings.

In the formation of the spherical particulates of the invention, starting powder materials may be chosen as single components, as unreacted mixtures of multi-component systems, or as pre-reacted multi-component compositions of the inorganic materials in the final desired form such as metals, alloys, oxides, carbides, borides, nitrides, ceramic or phosphor compositions. In the alternative, single component or multi-component (prereacted or unreacted) mixtures may contain precursors of one or more component of the final desired form of the inorganic material. As used herein, precursor means a material which upon heating in a non-reactive atmosphere will convert, usually by simple thermal decomposition, into the final desired form. For example, most carbonates, sulfates, nitrates, formates, oxalates, etc., upon heating at a temperature below about 1000° C decompose to the oxides of the metals. It is, of course, a requirement that any precursors decompose at temperatures below the decomposition temperature of the final desired form of the inorganic material.

The starting materials are slurried in an aqueous solution of a soluble organic binder material, which is capable of gellation in the presence of divalent or trivalent cations of soluble metal salts within a period to achieve substantially self-supporting spheres before contact with a solid surface or with other spheres, and preferably before substantial contamination by insoluble precipitates of the cations' salts can occur. In addition, the binder should be fugitive in its gelled state, that is substantially completely removable by volatilization at a temperature below the decomposition temperature of the final desired form of the inorganic materials.

Preferred binder materials are selected from the polysaccharides of plant extracts, such as pectin and alginic acid complexes, preferably with volatile cations, such as polypropylene glycol alginate and ammonium alginate.

The first phase of the two-phase sphere-forming liquid is of a hydrophobic or non-polar nature, for example, any water-immiscible liquid or combination of liquids such as methyl ethyl ketone, toluene, kerosine, etc. The function of this liquid is to convert tear drop or other irregular shaped droplets into spherical form and to maintain such spherical form of the droplets during their passage through this liquid to the interface with the second liquid phase.

The second liquid phase is ionic and contains the divalent or trivalent cations of soluble metal salts capable of promoting gellation of the organic binder in the spherical droplets. This liquid should be substantially immiscible with the first phase liquid and may be an aqueous salt solution containing the desired cations. In accordance with a preferred embodiment, where high purity is desired in the final product, the concentration of cations should be kept below a level at which precipitation of salts of the cation within the spheres is likely to occur prior to substantial completion of gellation of the binder. Similarly, selection of anion species in this liquid should be consistent with final desired purity requirements. For example, certain phosphites, phosphates, and polyphosphates otherwise known to be useful in controlling gellation time of alginates, are nevertheless to be avoided where highest purities are desired.

For most systems it is contemplated that the specific gravity of the droplets will be greater than that of both the first and second phase liquids, and that the specific gravity of the second phase liquid will be greater than that of the first phase liquids, so that the droplets are introduced at the top of the first phase liquid and settle by gravity to the bottom of the second phase liquid, at which point they may be collected and separated. Nevertheless, systems may be chosen in which the first phase liquid has the highest specific gravity and the droplets have the lowest specific gravity, so that droplets are injected at the bottom of the first phase liquid and rise to the top of the second phase liquid at which point they may be collected and separated. Such systems are contemplated as being within the scope of the invention.

The collected spheres may optionally be subjected to a variety of additional processing steps, such as for example washing to remove metal salt contaminants, drying, and one or more heating steps at successively higher temperatures, to first remove the gelled binder by volatilization, to convert any precursors to final desired form, to react unreacted components of multi-component systems, to strengthen the particles, and to densify the particles. As may readily be appreciated by those skilled in the art, reaction of components, strengthening and densification may all be achieved in one heat treatment operation carried out at sintering temperatures.

To aid the practitioner, the following examples are presented to illustrate certain aspects of the invention.

EXAMPLE I

About 15 grams of an ammonium alginate binder were dissolved in 1500 ml of water, and the resulting solution was slurried with about 3,000 grams of $Al_2O_3$, to produce a slurry having a specific gravity of about 2.00 g/cc. Droplets of the slurry having diameters of about 3 mm were injected by hypodermic needle into the top of a 36-inch by 1 inch in diameter column containing about 6 inches of an upper hydrophobic liquid of toluene having a specific gravity of about 1.13 g/cc and 30 inches of a lower gellation-promoting salt solution of calcium chloride. A series of spheres were produced for calcium chloride solutions having specific gravities ranging from 1.10 to 1.30 grams per cc. Spheres produced for the calcium chloride solutions having specific gravities of 1.18 and 1.30 grams per cc were analyzed for contamination by calcium, and results are shown in Table I below.

TABLE I

| Specific Gravity of $CaCl_2$ | Ca in $Al_2O_3$ |
|---|---|
| 1.18 | 25–50 ppm |
| 1.30 | 7% by weight |

As may be seen from the Table, as the specific gravity increased from 1.18 to 1.30 grams per cc, contamination by calcium increase from a trace to significant amounts. All of the spheres were sufficiently self-supporting to resist deformation after reaching the bottom of the 36-inch column, regardless of the concentration of calcium ions.

EXAMPLE II

The procedure of Example I was repeated for slurries of titanium carbide, tungsten carbide plus cobalt and zirconium dioxide, having specific gravities of 4.93 g/cc, 15.07 g/cc and 5.75 g/cc respectively, and for calcium chloride salt solutions having a specific gravity of 1.30 grams per cc. In each case satisfactory spheres were formed.

EXAMPLE III

The procedure of Example I was repeated, except that the alginate binder was replaced by pectin as a binder. Satisfactory spheres were obtained.

Figure 2:
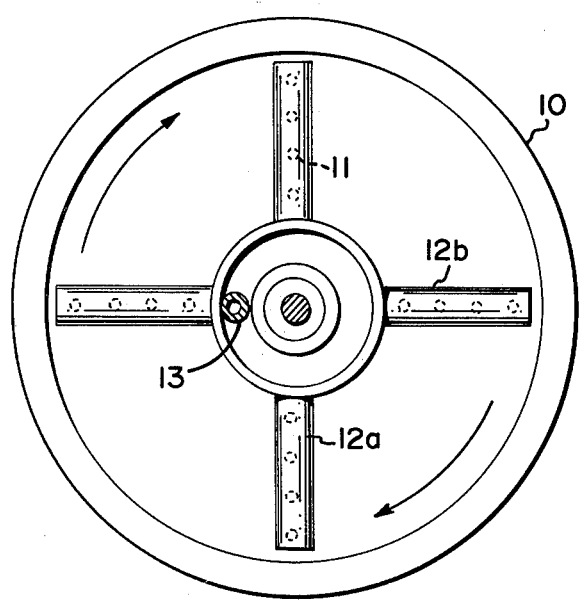
FIG. 2 is a top view of a portion of the apparatus of FIG. 1 showing a manifold system for introducing droplets into a two-phase sphere-forming liquid.

Referring now to FIG. 1, there is depicted one embodiment of an apparatus suitable for carrying out the method of the invention, wherein liquid column 10 has an open top portion above which is positioned droplet forming means including an array of tubes 11 extending downwardly into the container 10 from a supply manifold 12. Droplet forming liquid is supplied to manifold 12 through supply line 13 from holding tank 14, either by gravity or under pressure supplied through air pressure line 15. As shown in FIG. 2, which is a top view of the column, manifold 12 may be in the form of cross intersecting tubes 12a and 12b and rotated in a horizontal plane by variable speed motor and drive 16. Recirculation of the second phase ionic liquid in column 10 is achieved by means of liquid supply line 17 exiting column 10 from near the bottom portion thereof and entering intake side of liquid pump 18, and thereafter exiting the outlet side of pump 18 and re-entering column 10 in the central portion thereof just below the interface with the first phase hydrophobic liquid. The bottom portion of column 10 is provided with gate or valve means 19 for allowing liquid and spheres to fall into collection container 20. Container 20 is removably attached to column 10. The bottom portion of column 10 is optionally provided with screen 21 to prevent spheres larger than a predetermined size from being collected.

In operation, after the slurry has been prepared, it is deaire to remove entrapped air, poured into the slurry holding tank 14, and from there fed to manifold 12 and tube array 11. As the slurry drops through tube array 11 it is in the form of tear drops. It reforms into spheres in the upper hydrophobic solution. After dropping through this solution, it dwells on the interface between the hydrophobic and ionic solution for a short time, and then falls through the ionic solution where gellation occurs. Column 10 must be long enough to permit the spheres to gain sufficient green strength to support other falling spheres without deformation. Use of such an apparatus and method enables the production of uniform size spheres up to 4 mesh (4.76 mm) in diameter or larger.

While there has been shown and described what are at present considered the preferred embodiments of the invention, it will be obvious to those skilled in the art that various changes and modifications may be made therein without departing from the scope of the invention as defined by the appended claims.

I claim:
1. An apparatus for forming self-supporting spheres containing inorganic material, the apparatus comprising:
   a. a first liquid container having a bottom portion, a central portion and an open top portion, the container for holding a first two-phase liquid;
   b. valve means disposed at the bottom portion of said first liquid container for controllably removing liquid and self-supporting spheres from said first liquid container;
   c. means for recirculating a lower liquid phase of the two-phase liquid in said first liquid container from the bottom portion of the container to the central portion thereof, wherein said recirculating means comprises a liquid pump and a liquid supply line extending from the bottom portion of the first liquid container into the intake side of said liquid pump and re-entering the first liquid container from the outlet side of the pump at a central portion below the interface with the upper first phase of the two-phase liquid;
   d. means for introducing droplets of a second liquid into the upper portion of the said first liquid container, said means comprising: a liquid supply manifold comprising at least two cross intersecting tubes forming a horizontal plane and an array of tubes extending downwardly from the manifold and opening into the open top portion of the first liquid container; for supplying the second liquid to the manifold under pressure; and means for rotating the manifold in the plane about its point of intersection; and
   e. a second container removably attached to the bottom portion of first container below the valve means for collecting the self-supporting spheres.

* * * * *